(12) United States Patent
Bohn

(10) Patent No.: US 6,537,412 B1
(45) Date of Patent: Mar. 25, 2003

(54) PROCESS AND APPARATUS FOR PRODUCING MULTILAYERS

(75) Inventor: Hans Bohn, Schopfloch (DE)

(73) Assignee: Robert Burke GmbH, Freudenstadt (DE)

( * ) Notice: Subject to any disclaimer, the term of this patent is extended or adjusted under 35 U.S.C. 154(b) by 0 days.

(21) Appl. No.: 09/470,298

(22) Filed: Dec. 23, 1999

(30) Foreign Application Priority Data

Dec. 23, 1998 (DE) .......................................... 198 59 613

(51) Int. Cl.$^7$ .............................. B32B 31/20; H05K 3/46
(52) U.S. Cl. ........................ 156/288; 156/216; 156/250; 156/289; 156/307.4; 156/307.7
(58) Field of Search ................................. 156/204, 216, 156/223, 226, 227, 288, 289, 323, 307.4, 307.7; 29/830; 56/250

(56) References Cited

U.S. PATENT DOCUMENTS

| 3,932,250 A | | 1/1976 | Sato et al. |
| 4,875,283 A | * | 10/1989 | Johnston |
| 5,153,050 A | | 10/1992 | Johnston |
| 5,160,567 A | * | 11/1992 | Konicek et al. |
| 5,256,474 A | * | 10/1993 | Johnston |
| 5,286,330 A | * | 2/1994 | Azuma et al. ........ 156/307.4 X |
| 6,127,051 A | * | 10/2000 | Frater |
| 6,174,591 B1 | * | 1/2001 | Chu et al. |
| 6,179,947 B1 | * | 1/2001 | Maeda et al. |

FOREIGN PATENT DOCUMENTS

| DE | 2 425 778 A | | 12/1974 |
| DE | 41 16 543 | * | 11/1992 |
| DE | 196 28 163 A1 | | 2/1997 |
| DE | 197 31 537 | * | 10/1998 |
| WO | WO 96/10486 | | 4/1996 |
| WO | WO 97/25841 | | 7/1997 |

* cited by examiner

Primary Examiner—Curtis Mayes
(74) Attorney, Agent, or Firm—Akin, Gump, Strauss, Hauer & Feld, L.L.P.

(57) ABSTRACT

A process and an apparatus are provided for producing multilayers having on each of their two outer sides an outer metal foil and between them at least one additional layer. These foils and/or layer(s) are connected to each other by intermediate layers impregnated with adhesive, and the foils of several multilayers are stacked on top of each other, while a separation layer is inserted between them, and are then simultaneously pressed together. It is essential that the metal foil be placed around the separation layer on its underside, end side and upper side in a U-shape before the separation layer is supplied to the multilayer structure.

11 Claims, 3 Drawing Sheets

PROCESS AND APPARATUS FOR PRODUCING MULTILAYERS

BACKGROUND OF THE INVENTION

The invention relates to a process and an apparatus for producing multilayers, which have on both of their respective outer sides an outer electrically conducting foil, in particular a metal foil, and between them at least one inner layer with strip conductors, wherein these foils and the inner layer(s) are connected to each other by intermediate layers made of an adherable dielectric and by the action of pressure and temperature, such that several multilayers are stacked on top of each other, while a separation layer is inserted between them, and are then simultaneously pressed, whereby before pressing the separation layer is supplied to the foil stack together with the upper metal foil of the multilayer lying underneath it and the lower metal foil of the multilayer lying above it, and the prior application of the metal foils occurs on both sides of the separation layer, optionally in a clean room.

Multilayers of this type are required for manufacturing electric multilayer switches. Many different inner layers can be located in them between the two outer metal foils, wherein these can optionally also have electronic components.

The two outer layers are generally made out of thin copper foils. Lying between them, depending on the structure, are one or more electrically conducting inner layers, which are connected to each other and to the two outer metal foils by so-called prepregs. These prepregs are intermediate layers impregnated with adhesive, preferably resin-impregnated glass fiber webs, in which the resin functioning as adhesive is partially polymerized to the extent that the prepregs are not yet adhesive at room temperature. However, the resin acting as adhesive and dielectric begins to melt at higher temperatures and cures completely under the action of temperature and pressure. The individual layers of the multilayer are then inseparably connected to each other, and the electrically conducting layers are isolated from each other.

So that the multilayer can be manufactured economically, it is customary to stack several multilayers on top of each other and then to compress them at the same time. With this mutual compressing, however, the outer metal foils would each rest on adjacent multilayers, which has the result that the metal foils would adapt to the resin flow of the prepreg melting below them and thus would no longer be smooth and even. However, it is necessary to have as even an outer metal layer as possible, because by etching off the unnecessary metal surface, the strip conductors of the outer switch can be generated from it. These strip conductors cannot be manufactured with the necessary degree of precision with an uneven outer metal layer.

It is therefore known, in order to keep the outer metal foils smooth, to insert a separation layer, in general a separation sheet, between the respective multilayers that are stacked on top of each other. This separation sheet has a very fine surface structure, so that the metal foils pressed against it are not deformed, but instead are kept planar and smooth.

In case prior to the compression of the foil, foreign substances, in particular dirt particles, come between the separation sheet and the metal foil, this would lead to the rejection of the multilayer, since the particles could punch through the metal foil and consequently cause an interruption in one of the strip conductors prepared later, and thus make necessary a later repair or lead to rejection.

Similarly, it is disadvantageous if these particles are made of resin, because the resin spreads over a large area when it melts and adheres to the separation sheet. In the metal foil not only would the already described irregularity then result, but also the separation sheet must then be expensively cleaned.

The prepegs themselves constitute a great danger of impurities, since they must first be cut to size and then stacked with the other layers on top of each other. In this condition, splinters from the glass fiber web or loosely adhering resin pieces can be released and fall on the metal foil or the separation sheet. Painstaking attention must thus be paid at the assembly point that the respective sides of the metal foils and the separation sheets, which come to lie against each other during the compression operation, are absolutely free of contaminants.

It is thus also known to handle the inner layers and prepegs separately from the separation sheet and the metal foil, particularly such that the metal foils and separation sheets are positioned and laid together in a clean room, while the inner layers and prepegs are positioned and laid together in a standard room. The metal foils are thereby adhered below and above to the separation sheet. The individual parts of the multilayer then go back and forth between standard room and clean room, since they are laid on at different locations. The production thereby becomes somewhat more complicated, and the transport between standard room and clean room generates an additional risk of contamination.

SUMMARY OF THE INVENTION

Starting from this background, an object of the invention is to improve the manufacture of multilayers going forward, so that the risk of contamination between the separation layer—designated above as a separation sheet—and the metal foil is for the most part eliminated. Moreover, the invention should distinguish itself by simple process steps.

This object is achieved according to the invention in that the metal foil is placed around the separation layer on its underside, end side and upper side in a U-shape, before the separation layer with the two-sided metal foil is supplied to the unfinished multilayer stack.

The metal foil thus practically encases the separation layer and protects it, as well as the intermediate space between it and the separation layer, from the environment. A penetration of contaminants, in particular during the transport of the separation layer and its metal foil, is greatly reduced in this way.

It is especially favorable when the metal foil is placed around the forward-lying end side of the separation layer in the travel direction of the multilayer structure, since on the forward side the danger of contamination is greater than it is in the back.

In practice, the desired encasing of the separation layer can be produced by working with a metal foil that is approximately twice as long as a separation layer, whereby the separation layer is then placed on the rear half of the metal foil in the travel direction of the multilayer structure, and the uncovered front half of the metal foil is finally folded over 180° onto the upper side of the separation layer. For this purpose, a conveyor belt subdivided approximately in the middle is used, on which the metal foil is placed, so that then the separation layer is laid over it, and then an application roller arranged in the subdivision area of the conveyor belt grasps onto the metal foil from below, is pivoted upwardly, and finally the metal foil is rolled on top of the separation layer. With additional re-press rolling, a planar deposition of the metal foil on the separation layer is ensured and trapped air is rolled out.

With the encasing according to the invention, the additional advantage is offered that the separation layer can be covered with its metal foil in a clean room, and only after its encasing is it conveyed into the standard room and placed on the layers of the uppermost multilayer that are already stacked there on each other. The inner layers and prepegs can thus always remain in the standard room and not lead to any contamination of the clean room.

So that the transport of the separation layer with its metal foil from the clean room into the standard room is additionally protected from contamination, it is recommended to seal off the intermediate space between the separation layer and the metal foil also on the two opposite-lying sides running in the transport direction. This can preferably be done by grippers that carry out the transport at the same time. In this manner, the metal foil is constantly held on the separation layer without adhesive.

After the compression and curing operation, the multilayers stacked on top of each other are still connected to each other by the metal foils. The separation of the multilayers is possible at any time by a simple cutting of the metal foil in the transition area, and for this purpose the multilayers are expediently unfolded, and the separation sheet removed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESRIPTION OF THE INVENTION

Figure 1:
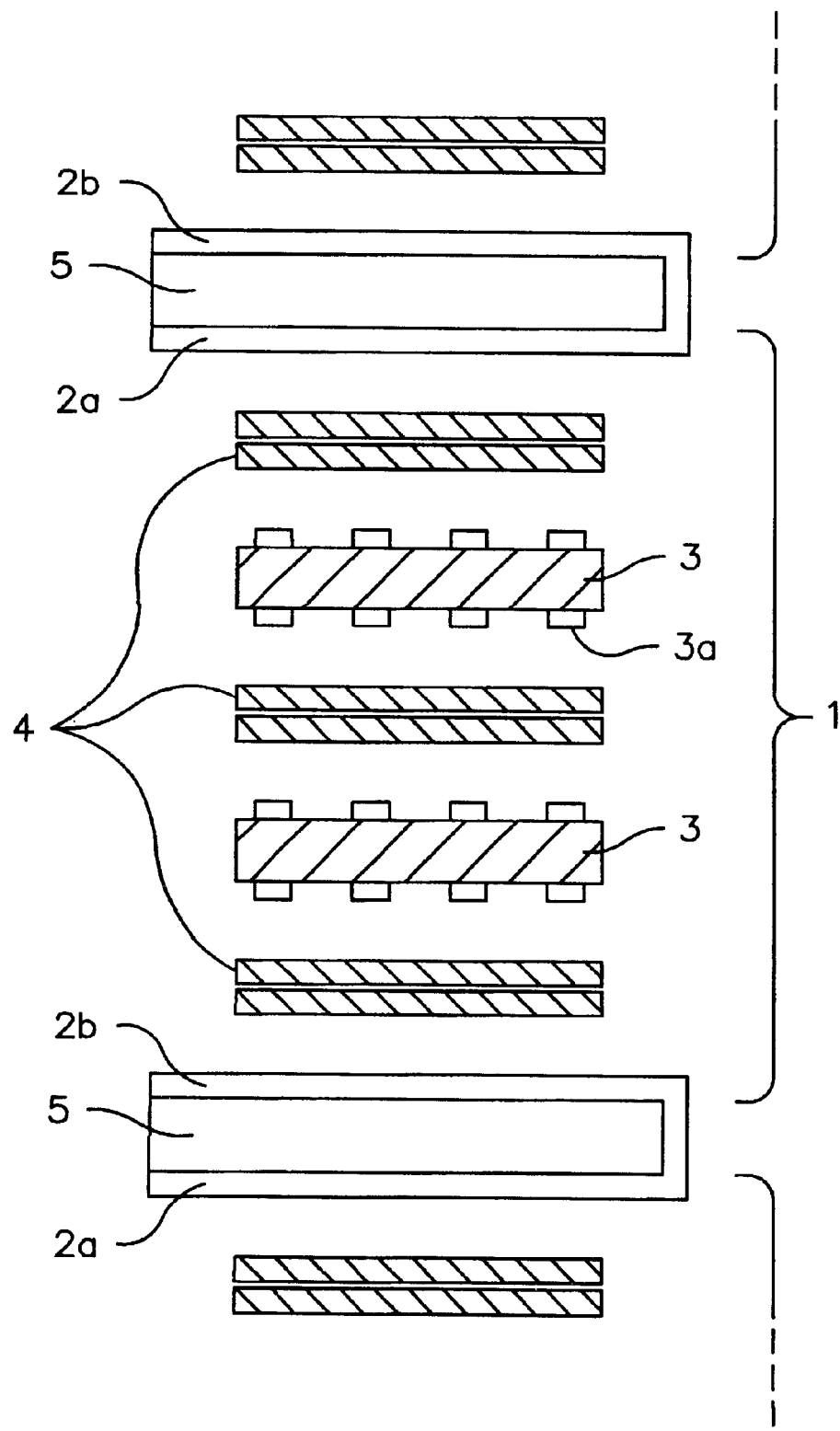
FIG. 1 is an exploded cross-sectional view showing the construction of a multilayer.

In FIG. 1 one recognizes a multilayer 1, in which the individual layers are depicted set apart from each other. It consists of an upper outer layer 2a and a lower outer layer 2b, which are made of metal foils, in particular copper foils, of two inner layers 3, which are equipped with strip conductors 3a, and of three intermediate layers 4 impregnated with adhesive, the so-called prepregs, which are arranged respectively between the layers mentioned.

Fundamentally, the layer structure of the multilayers 1 can be any one desired. It is only essential that it have electrically conducting foils 2a and 2b on its two outer sides. The present embodiment involves a six-layer multilayer, since it contains six conducting levels. Below and above the described multilayer 1, one recognizes the extremities of the adjacent multilayers, and the development of the metal foils 2a and 2b according to the invention is also readily apparent.

As mentioned at the outset, adjacent multilayers are respectively separated from each other by a separation layer 5, in particular a separation sheet, so that the adjacent metal foils do not become deformed and uneven during the pressing operation. It is now essential that the metal foils 2a and 2b are not arranged as was customary until now, separately on the upper side and underside of the separation sheet, but instead that a single metal foil 2a, 2b runs through from top to bottom as a single piece, and thus surrounds the separation layer 5 in a U-shape. In this way, for example, the upper region 2b of the lower metal foil forms the lower extremity of multilayer 1, while the lower area 2a of the lower metal foil forms the upper extremity of an only partially depicted multilayer located below it.

In FIG. 1 the individual layers are depicted greatly exaggerated in their thickness for purposes of illustration. Actually, these layers are mostly only a few hundredths of a millimeter to several tenths of a millimeter thick.

Figure 2:
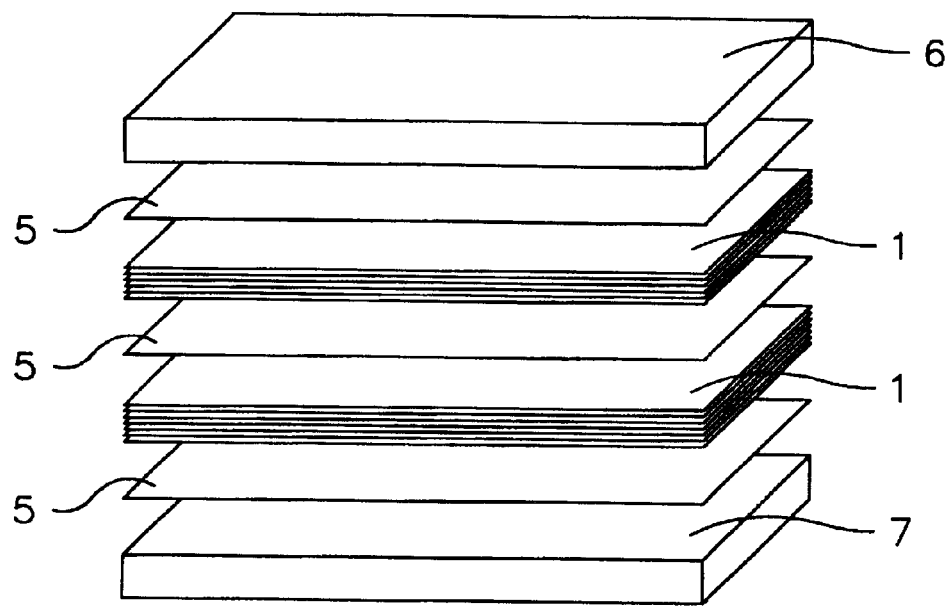
FIG. 2 is an exploded perspective view of a pressed stack consisting of several multilayers.

FIG. 2 shows the construction of a pressed stack, depicted in exploded view, which consists of two (in reality more) multilayers 1, wherein the metallic outer layers 2a, 2b are respectively arranged on the separation layers 5, which are located between the multilayers both above and below. This pressed stack is arranged between an upper and lower press jig 6 and 7, which is also designated as a tool. In this process, the lower press jig 7 can be used as a carrier during transport.

Figure 3:
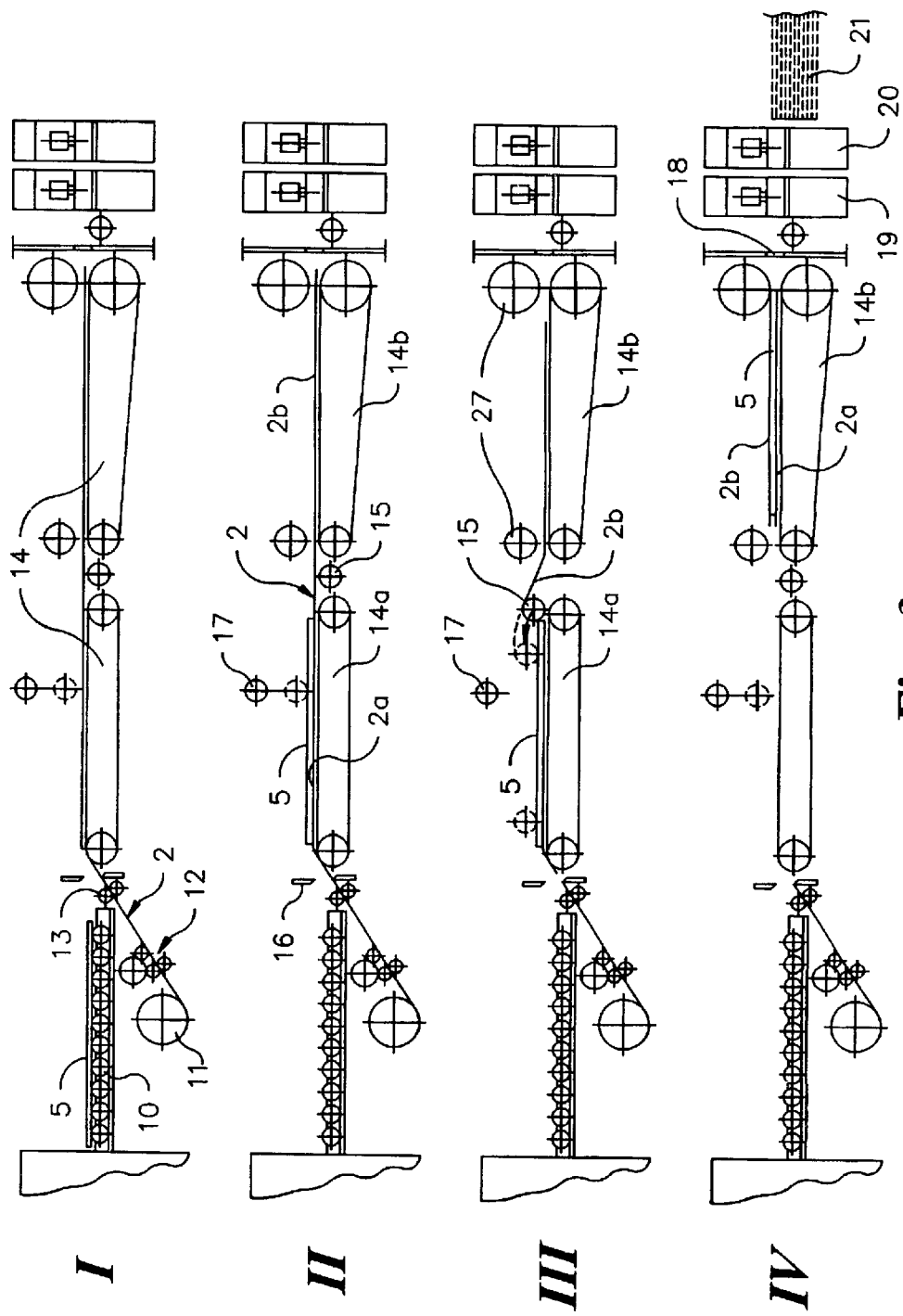
FIG. 3 is a series of schematic diagrams showing the steps of the manufacuring process for the multilayers.

The manufacture of the separation layers encased with metal foil can be ascertained from FIG. 3, wherein sequential process steps I to IV are shown. In the uppermost diagram I, for the first process step one recognizes a separation layer 5, which lies on a roller conveyor 10 with an orientation device that is not shown in greater detail. Below that, a metal foil 2 is wound up on a roller 11. This metal foil runs over a cleaning device with a static charge eliminator and optionally a smoothing device 12 to a pair of conveyor rollers 13. These conveyor rollers pull the foil 2 off the roller 11 and guide it to conveyor belt 14. The conveyor rollers 13 can alternatively be replaced by a gripper pulling device.

The conveyor belt 14 consists of two conveyor belts following each other in the conveyor direction, but spaced apart from each other, wherein each is approximately as long as the separation layer 5. The two conveyor belts 14a and 14B are synchronized with each other at least part of the time, as illustrated in FIG. 3.

The foil 2 is now pulled up so far that it extends from front to back over the entire conveyor belt 14. This condition is depicted in the upper diagram I. Then, according to diagram II, the separation layer 5 is conveyed by the roller conveyor 10 and/or with suctions gripping from above toward the right over the pulled out foil 2, but only to the extent that it comes to lie above the left half 14a of the conveyor belt, while the front half of the foil stays uncovered. This condition is depicted in diagram II.

Then, an application roller 15, arranged in the intermediate space between the two conveyor belts 14a and 14b, is activated. This application roller 15 drives against the underside of the foil 2 and lifts this up until the roller can roll rearwardly along the upper side of the separation layer 5. It thereby pulls the uncovered part 2b of the foil rearwardly and lays it down: gradually on the upper side of the separation layer 5. This is apparent in diagram III, where the application roller 15 is depicted in three different positions.

So that the application roller 15 does not lift the separation layer 5 when it is driven up, a hold-down roller 17 drives downwardly and holds the separation layer 5 in its position; see diagram II, where the hold-down roller 17 is depicted in the lower position in dashed lines. It only drives back up once the application roller 15 begins the roll-back operation on the upper side of the separation layer 5. At approximately the same time, the foil is separated from the roller 11 by a cutting operation 16. The foil can, however, also be pulled out to a length, cut off, and then positioned.

With the application roller 15, or instead with additional pressing rollers, it is ensured that the folded-over upper position 2b of the foil remains lying flat on the separation layer 5, and that air between the separation layer and the metal foil is pressed out.

Thereafter, the separation layer 5 with all of its metal foils is transported away by the conveyor belt 14b and re-press rollers 27 to the right through a wall opening 18 out of the clean room. The intermediate stage is depicted in the lower diagram IV.

The continued transport in the connecting standard room on the right occurs by two gripper pairs 19 and 20. These gripper pairs are mounted on guides (not shown) and transport the separation layer with its metal foil to the schematically indicated assembly position 21, where it is then deposited on the multi-layer structure laid out there.

The described transport in the standard room expediently occurs in the manner that the front part of the metal foil-separation layer-metal foil sandwich 5, 2a, 2b is grasped by the rear gripper pair 20 and carried over the assembly position, whereas the front gripper pair 19 comes into play when the rear part of the sandwich exits from the/clean room. Thereafter, both gripper pairs proceed simultaneously, in order to deposit the sandwich in the exact position on the assembly position 21. The grippers 19 and 20 are expediently designed so that they simultaneously seal off the outer side of the sandwich that faces the gripper pairs when grasping the sandwich, so that no contaminant can penetrate between the separation layer and the metal foil during transport.

The subsequent press and curing operation of the multilayers stacked on each other is completed in the known manner and is therefore not discussed further here.

In summary, the invention is distinguished by a simple, but reliable protection from contamination of the separation layer and the sides of the metal foil lying against it.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

I claim:

1. A process for producing multilayers (1) having on both of their outer sides an outer metal foil (2a, 2b) and between them at least one inner layer (3), wherein the foils (2a, 2b) and the inner layer(s) (3) are connected to each other under effect of pressure and temperature by intermediate layers (4) impregnated with adhesive, comprising the steps of applying the metal foils (2a, 2b) to both sides of a separation layer(s) (5), stacking the foils of a plurality of multilayers (1) on top of each other while a separation layer (5) is inserted between them, and then simultaneously pressing the multilayer stack with inserted separation layer(s) (5), wherein the separation layer (5) is inserted in the multilayer stack together with an upper metal foil (2b) of a multilayer (1) lying underneath it and a lower metal foil (2a) of a multilayer (1) lying above it, wherein the metal foil (2a, 2b) is applied around the separation layer (5) on its underside, end side and upper side in a U-shape before the separation layer (5) is inserted in the multilayer stack, and wherein the metal foil (2a, 2b) is placed on a conveyor belt (14) that is subdivided in a transport direction, the separation layer (5) is laid over a portion (2a) of the metal foil, and an application roller (15) arranged in an area of the subdivision of the conveyor belt (14) grasps onto the metal foil from below, drives up past the end side of the separation layer (5) and then continues above the separation layer (5) and lays a remaining portion (2b) of the metal foil over the separation layer (5).

2. The process according to claim 1, wherein the metal foil (2a, 2b) is applied around a forward end side of the separation layer (5) as viewed in its travel direction to the multilayer stack.

3. The process according to claim 1, wherein the subdivided conveyor belt (14) comprises two conveyor belt sections (14a, 14b) which are each approximately as long as the separation layer (5).

4. The process according to claim 3, wherein the two conveyor belt sections (14a, 14b) are synchronized with each other at least part of the time.

5. The process according to claim 1, wherein an upper area (2b) of the metal foil is rolled by re-press rollers (27) onto the separation layer (5).

6. The process according to claim 1, wherein the separation layer (5) is covered with its metal foil (2a, 2b) in a clean room, and then is conveyed into a standard room to an assembly position (21) and laid on layers (3, 4) of an uppermost multilayer, which are already stacked there on each other.

7. The process according to claim 1, wherein the separation layer (5) with its metal foil (2a, 2b) is sealed off laterally at least locally during transport to an assembly position (21).

8. The process according to claim 7, wherein the seal is made by laterally grasping grippers (19, 20), and these grippers simultaneously perform the transport of the separation layer (5) with its metal foil (2a, 2b).

9. The process according to claim 1, wherein the multilayers (1) stacked on top of each other are separated after the pressing step by dividing the respective metal foils (2a, 2b).

10. The process according to claim 1 wherein the application of the metal foil (2a, 2b) around the separation layer (5) occurs in a clean room.

11. The process according to claim 1, wherein the metal foil (2a, 2b) is approximately twice as long as the separation layer (5), the separation layer (5) is then laid on a rear half (2a) of the metal foil in a travel direction of the foil, and a front half (2b) of the metal foil is folded over onto an upper side of the separation layer 5).

* * * * *